(12) United States Patent
Ermolov

(10) Patent No.: US 12,321,138 B2
(45) Date of Patent: Jun. 3, 2025

(54) HIGH-FREQUENCY REFERENCE DEVICE

(71) Applicant: TEKNOLOGIAN TUTKIMUSKESKUS VTT OY, Espoo (FI)

(72) Inventor: Vladimir Ermolov, Vtt (FI)

(73) Assignee: TEKNOLOGIAN TUTKIMUSKESKUS VTT OY, Espoo (FI)

( * ) Notice: Subject to any disclaimer, the term of this patent is extended or adjusted under 35 U.S.C. 154(b) by 0 days.

(21) Appl. No.: 18/553,331

(22) PCT Filed: Feb. 18, 2022

(86) PCT No.: PCT/FI2022/050107
§ 371 (c)(1),
(2) Date: Sep. 29, 2023

(87) PCT Pub. No.: WO2022/207964
PCT Pub. Date: Oct. 6, 2022

(65) Prior Publication Data
US 2024/0192642 A1    Jun. 13, 2024

(30) Foreign Application Priority Data
Apr. 1, 2021 (FI) ..................... 20215400

(51) Int. Cl.
*G04F 5/14* (2006.01)
*H03L 7/26* (2006.01)

(52) U.S. Cl.
CPC . *G04F 5/14* (2013.01); *H03L 7/26* (2013.01)

(58) Field of Classification Search
CPC ... H03L 7/26; G04F 5/14; G04F 5/145; H03B 17/00
See application file for complete search history.

(56) References Cited

U.S. PATENT DOCUMENTS

| | | |
|---|---|---|
| 2014/0368377 A1 | 12/2014 | Nadeau et al. |
| 2014/0373599 A1 | 12/2014 | Trombley et al. |
| 2016/0291549 A1 | 10/2016 | Herbsommer et al. |
| 2018/0159547 A1 | 6/2018 | Herbsommer et al. |
| 2019/0071304 A1 | 3/2019 | Fruehling et al. |
| 2019/0071306 A1* | 3/2019 | Herbsommer ...... B81C 1/00047 |
| 2019/0204786 A1 | 7/2019 | Herbsommer et al. |

(Continued)

OTHER PUBLICATIONS

Finish Patent and Registration Office, Search Report for FI 20215400, dated Nov. 24, 2021, 2 pages.

(Continued)

*Primary Examiner* — Ryan Johnson
(74) *Attorney, Agent, or Firm* — Robert P. Michal, Esq.; Carter, DeLuca & Farrell LLP

(57) ABSTRACT

A frequency reference device comprising a waveguide with a first end and a second end, a signal transmitter module for generating a high-frequency electromagnetic wave in the waveguide, and a signal receiver module for receiving the high-frequency electromagnetic wave in the waveguide. The component comprises a sealed enclosure, and said sealed enclosure is filled with a gas. The waveguide, first and second radiation coupling probes and the signal transmitter module and the signal receiver module are all located within said sealed enclosure.

4 Claims, 4 Drawing Sheets

(56) References Cited

U.S. PATENT DOCUMENTS

| | | |
|---|---|---|
| 2019/0204788 A1 | 7/2019 | Dellis et al. |
| 2019/0235445 A1 | 8/2019 | Han et al. |
| 2019/0346814 A1 | 11/2019 | Fruehling et al. |
| 2020/0387115 A1* | 12/2020 | Herbsommer .......... H03B 17/00 |
| 2023/0327678 A1* | 10/2023 | Herbsommer ........... H01Q 1/38 |
| | | 331/94.1 |

OTHER PUBLICATIONS

European Patent Office, International Search Report and Written Opinion of the International Searching Authority for PCT/FI2022/050107, mailed May 16, 2022, 9 pages.

Kim, M., et al. "Chip-Scale Terahertz Carbonyl Sulfide Clock: An Overview and Recent Studies on Long-Term Frequency Stability of OCS Transitions", IEEE Transactions on Terahertz Science and Technology, vol. 9, No. 4, Jul. 2019, pp. 349-363.

* cited by examiner

HIGH-FREQUENCY REFERENCE DEVICE

CROSS-REFERENCE TO RELATED APPLICATIONS

The present application is a U.S. national stage application of International Application No. PCT/FI2022/050107, filed Feb. 18, 2022, which claims priority to and the benefit of Finnish Application No. 20215400, filed Apr. 1, 2021, the contents of which are incorporated herein by reference and made a part hereof.

FIELD OF THE DISCLOSURE

The present disclosure relates to time-keeping devices and particularly to accurate frequency references. The present disclosure further concerns high-frequency reference devices where the rotational transition absorption of gas molecules is utilized for frequency reference purposes.

BACKGROUND OF THE DISCLOSURE

Many electronic devices require highly accurate, stable and energy-efficient frequency references (which may also be called clocks), but recently developed frequency-reference devices which utilize quartz-crystals or microelectromechanical oscillators suffer from frequency drift. There is a need for frequency-reference devices which can maintain the same output frequency for long time periods.

Devices which utilize rotational transitions of polar gaseous molecules provide one avenue toward stable low-cost, low-power miniaturized frequency-reference clocks. In such clocks a sub THz (~200-300 GHz) or THz (above 300 GHz) waveguide is filled with a gas with polar molecules. A high frequency wavelength-modulated probing signal passes through the waveguide. The gas molecules exhibit a rotational energy transition at sub THz and THz frequencies. Rotational spectral lines have a high-quality factor and strong absorption intensity. Thus part of the energy of the electromagnetic probing signal will be absorbed by the gas at the transition frequencies. The selected transition frequency is an invariant constant and the energy of the electromagnetic wave in the waveguide will indicate with high accuracy whether or not the probing frequency is exactly equal to the transition frequency. By locking onto the molecular transition frequency a molecular clock can achieve high frequency stability.

The paper Kim et al; Chip-scale Terahertz Carbonyl Sulfide Clock: An Overview and Recent Studies on Long-Term Frequency Stability of OCS Transitions (IEEE Transactions on Terahertz Science and Technology, vol. 9, no. 4, p. 349-363, July 2019), discloses a device based on carbonyl sulfide gas encapsulated within a waveguide. The hermeticity of the waveguide is obtained via usage of two sections of optically transparent epoxy filling in the ends of the waveguide to seal the gas inside the waveguide. The electrical connection between transmitting and receiving electronics which produce and receive the probing signal is realized via coupling probes.

A problem with this approach is that the waveguide must be hermetically sealed for gas confinement, and it is not easy to effectively (with low losses) transmit a high-frequency electromagnetic wave from transmitter electronics to the waveguide and from the waveguide to the receiver electronics through a hermetic sealant. In other words, it is not easy to achieve both hermeticity and good signal transmission without having to employ complicated and expensive sealing and transmission arrangements.

FIG. 1 illustrates schematically a frequency reference device known from the prior art. The device comprises a waveguide 11 with a first end 111 and a second end 112. The waveguide 11 is hermetically sealed. A gas 19 is confined within the sealed waveguide 11. The gas is not present outside of the waveguide. Hermetic sealing elements 141-142 must be implemented to seal the waveguide.

The device in FIG. 1 also comprises a radiation transmitter 131 where a high-frequency electromagnetic wave can be generated and a first radiation coupling probe 121 which extends into the waveguide 11 at its first end 111. The device also comprises a second radiation coupling probe 122 which extends into the waveguide 11 at its second end 112 and a radiation receiver 132 where the guided electromagnetic wave can be received. The transmitter and receiver may be connected to additional electronic units such as 133.

In the device shown in FIG. 1, the high-frequency probing signal which is transmitted by the first radiation coupling probe 121 and then received at the second radiation coupling probe has to pass through hermetic sealing elements 141-142 on both occasions. This leads to extra losses and lower sensitivity.

BRIEF DESCRIPTION OF THE DISCLOSURE

An object of the present disclosure is to provide an apparatus which alleviates the above disadvantages.

The object of the disclosure is achieved by an arrangement which is characterized by what is stated in the independent claim. The preferred embodiments of the disclosure are disclosed in the dependent claims.

The disclosure is based on the idea of enclosing both a waveguide and a part of the transmission and receiver electronics in a sealed enclosure filled with a gas.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

Figure 1:
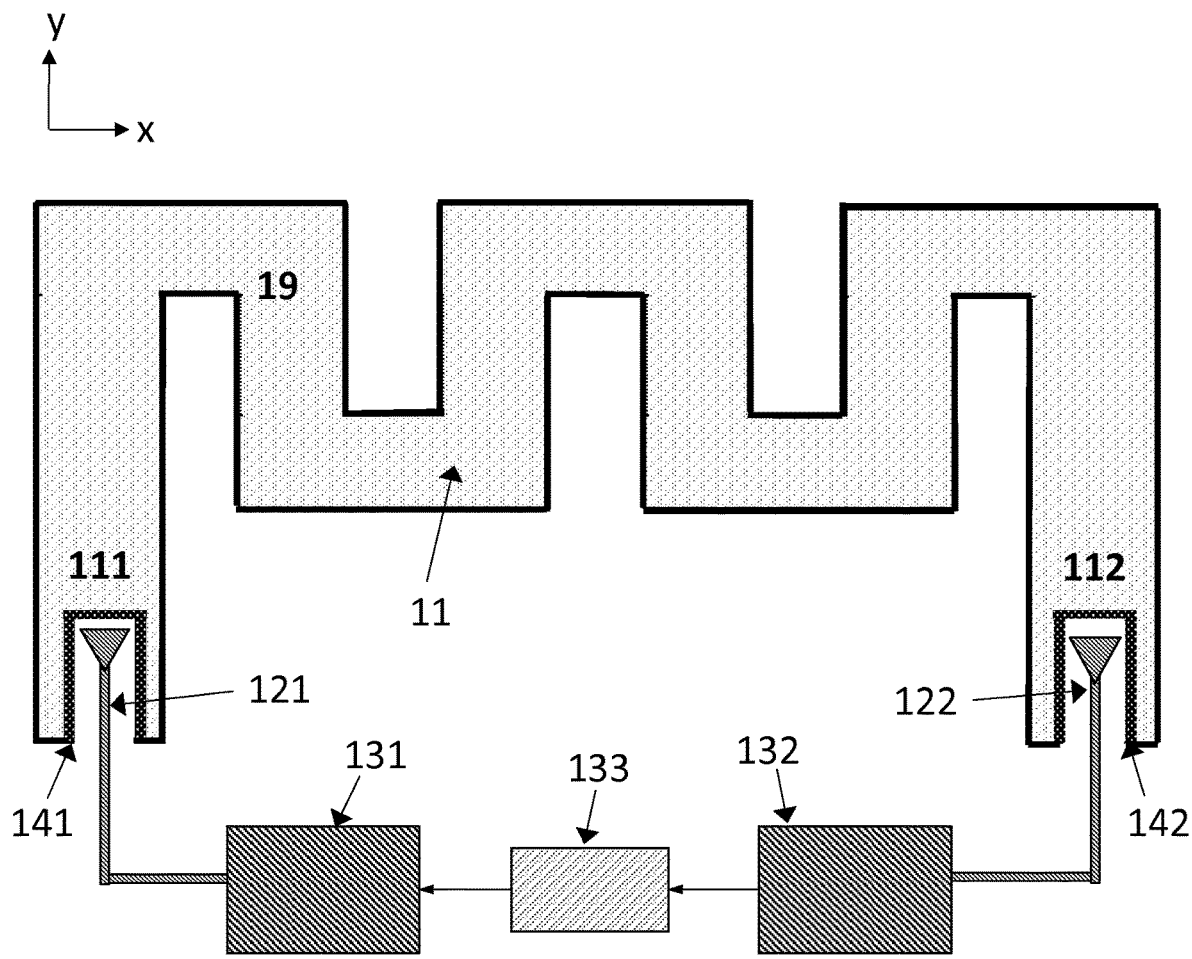
FIG. 1 illustrates a frequency reference device known from the prior art.
Figure 2:
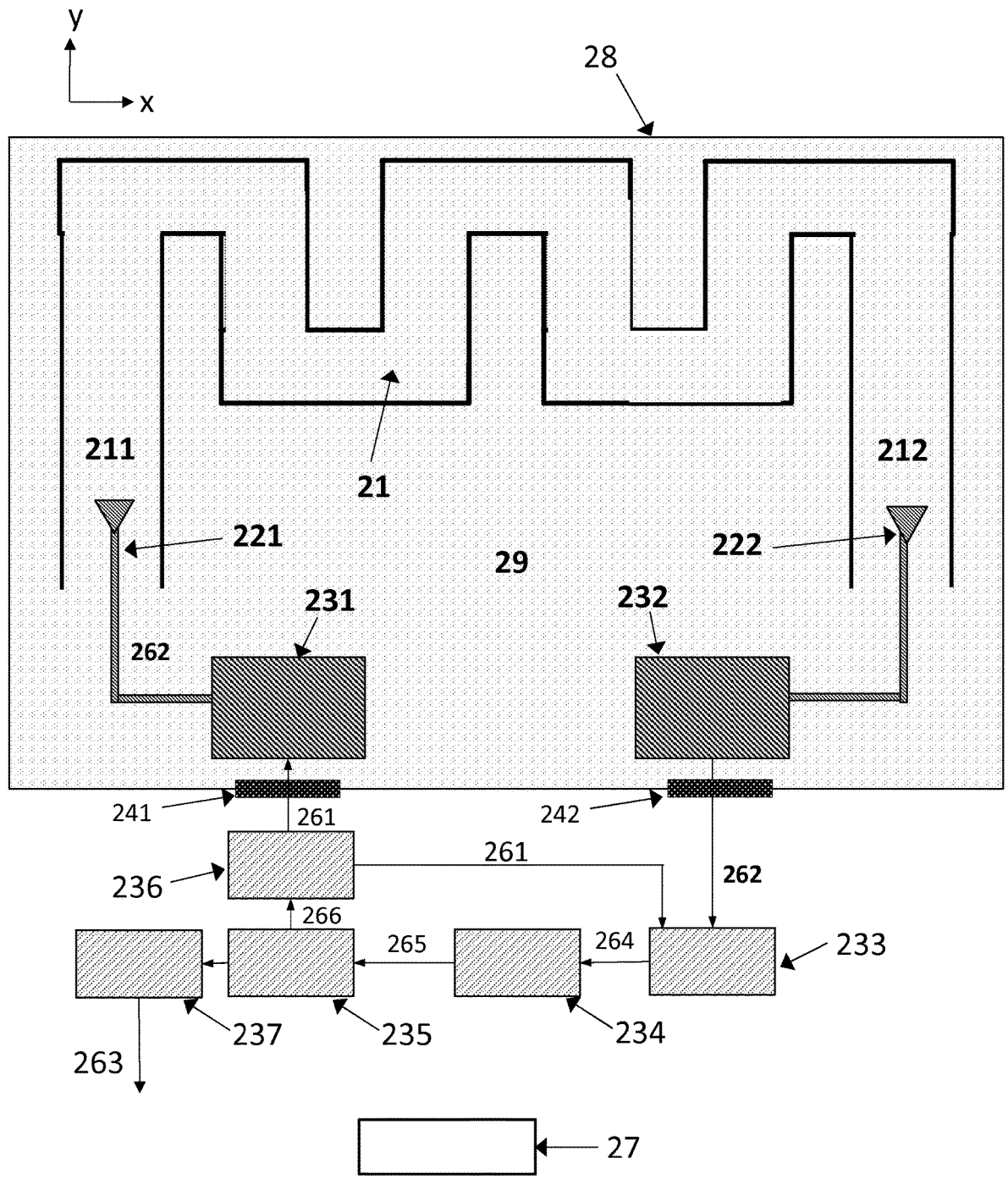
FIG. 2 illustrates a frequency reference device where the transmitter and receiver are inside the sealed enclosure.

This disclosure describes a frequency reference device which is illustrated in FIG. 2. It comprises a waveguide 21 with a first end 211 and a second end 212. The frequency reference device also comprises a signal transmitter module 231 for generating a high-frequency electromagnetic wave in the waveguide 21 and a signal receiver module 232 for receiving the high-frequency electromagnetic wave in the waveguide 21.

The signal transmitter module 231 is connected to a first radiation coupling probe 221 which is coupled to the waveguide 21 at its first end 211. The signal receiver module 232 is connected to a second radiation coupling probe 222 which is coupled to the waveguide 21 at its second end 212. The frequency reference device further comprises a sealed enclosure 28 and said sealed enclosure 28 is filled with a gas 29. The waveguide 21, the first and second radiation coupling probes 221-222 and the signal transmitter module 231 and the signal receiver module 232 are located within said sealed enclosure 28.

This arrangement has the advantage that possible losses resulting from the wireless transmission of high-frequency signals through hermetic sealants can be avoided. The first and second radiation coupling probes 221 and 222 may be coupled to the waveguide 211 by extending into the waveguide as FIG. 2 illustrates. Alternatively, they may be coupled to the waveguide 21 by being placed in close proximity to the first (211) and second (212) ends of the waveguide, respectively.

The signal transmitter module 231 and the signal receiver module 232 may for example be connected to a control circuit which comprises a frequency adjuster and a frequency-counter which generates a frequency-reference signal 263. The control circuit may comprise a voltage-controlled oscillator 235 (for example a voltage-controlled crystal oscillator, VCXO) which is coupled to an RF signal generator 236. The voltage-controlled oscillator 235 sends a clock signal 266 to the signal generator 236, and the signal generator 236 generates a high-frequency input signal 261 for the signal transmitter module 231. The module 231 transmits a probing signal 262 to the first coupling probe 221.

The high-frequency input signal 261 may also be connected as a first input to a lock-in amplifier 233. The second input to the lock-in amplifier 233 may be the probing signal 262 which is received by the signal receiver module 232. A phase-locked loop can then be formed with a loop filter 234 which provides a control signal 265 to the voltage-controlled oscillator 235 to adjust the frequency of the clock signal 266 which is transmitted to the tunable signal generator 236.

In other words, the output of the signal generator 236 is electrically connected with the first radiation coupling probe 221 and the first input of the lock amplifier 233. The second radiation coupling probe is connected via a low noise amplifier with a second input of the lock in amplifier. The lock-in amplifier provides an error signal 264 as an in-phase output. The error signal 264 is converted into the control signal 265 in a loop filter 234 or any other controller circuit which can be used to control the frequency which the voltage-controlled oscillator 235 outputs to the tunable signal generator in signal 266.

The high-frequency input signal 261 produced in the tunable signal generator 236 can thereby be maintained at a peak absorption frequency of a selected rotational spectral line in the dipolar molecular gas 29 which fills the waveguide 21. The frequency of the clock signal 266 will also be fixed to a given value. A frequency counter 237 may be connected to the output of the voltage-controlled oscillator 235 to produce a frequency-reference signal 263 which will form a stable frequency reference. The clock signal and the frequency-reference signal will typically have a frequency which is below the sub-THz and THz probing frequency. The frequency reference device may also comprise a power supply 27, which may be connected to all electric components in the device (these connections are not illustrated).

In this disclosure, the term "high-frequency" refers to a frequency which lies in the sub THz range (100-300 GHz) or in the THz range (300 GHZ-3 THz). The frequency of the signal 262 emitted by the signal transmitter module to the waveguide may be called the probing frequency.

The waveguide may for example have a meandering shape as FIG. 2 illustrates, but it could alternatively be straight, or it could have any other shape. The waveguide may be formed by etching a cavity in a substrate, for example a silicon substrate. The cavity may alternatively be formed in a substrate by other micromachining methods. The cavity may then be covered to form the waveguide. The sidewalls, the floor and/or the ceiling of the waveguide may be coated with a reflecting material, for example a metallic material to improve confinement of the electromagnetic wave within the waveguide.

In the figures of this disclosure the waveguide is presented in an xy-plane which may be called a device plane. In addition to having a length dimension (extending from the first end of the waveguide to its second end) and a width dimension (extending perpendicular to the length dimension), the waveguide has a height dimension in the z-direction. However, the waveguide could have any suitable geometry. The optimal geometry of the waveguide will depend on the selected operational frequency.

The gas may for example be carbonyl sulfide ($^{16}O^{12}C^{32}S$). The frequency of the probing signal can for example be fixed to the 231.061 GHz rotational spectral line of carbonyl sulfide ($^{16}O^{12}C^{32}S$). When this gas is used, the height×width (or width×height) cross-section of the waveguide may be 0.864×0.432 mm$^2$ and the length of the waveguide may be approximately 14 cm for signal to noise optimization. Other rotational spectral lines can also be used. The height and width of the waveguide may then for example lie in the ranges 0.7 mm-1.1 mm and 0.35 mm-0.8 mm, respectively. The length of the waveguide may lie in the range 10 cm-20 cm. The surface area of the sealed enclosure in the xy-plane may for example be in the range 1 cm$^2$-4 cm$^2$. The sealed enclosure may for example be formed from a metallic or ceramic frame which is attached with an adhesive or solder to the substrate where the waveguide and the electronics have been formed. A lid may be integrated with the frame or soldered or welded to the frame, and the gas can be brought into the enclosure through an opening which then sealed.

The signal transmitter module 231 may comprise a monolithic microwave integrated circuit (MMIC) which, together with the signal generator 236, forms a high-frequency Tx unit. The signal transmitter module 231 may comprise at least a power amplifier. The signal generator 236 may be a tunable signal generator. The clock frequency provided by the voltage-controlled oscillator 235 in the clock signal 266 may for example be in the MHz range. The signal generator 236 may multiply this clock frequency by a constant multiplier so that the high-frequency input signal 261 obtains a frequency in the sub-THz or THz range. The probing frequency may be equal to the frequency of the high-frequency input signal. The signal receiver module 232 may comprise a MMIC which forms a high-frequency Rx unit. This module may for example comprise at least a low-noise amplifier.

The signal generator 236 and the elements of the phase-locked loop 233-235 are located outside of the sealed enclosure 28. They are connected to the signal transmitter module 231 and to the signal receiver module 232 through hermetic connectors 241 and 242.

In one form of operation the transmitter transmits sub-THz or THz signals at full transmission power at various frequencies within a defined band around an expected rotational transition frequency at which the transmission efficiency of the gas cell in the waveguide is minimal (absorption of the signal is maximal). When the system finds the transition frequency, the lock-in amplifier provides an error signal 264 to the loop filter 234 to regulate the probing signal via the control of the tunable signal generator 236.

The technical benefit of the arrangements illustrated in FIG. 2 and in subsequent figures is that there is no need to package the gas 29 inside the waveguide hermetically. At least one end of the waveguide 21 may be open, as FIG. 2 illustrates. In this context, an open end means an end where the gas 29 can flow from the waveguide 29 to the other parts of the sealed enclosure 28, and vice versa. An open end could be completely without any physical barrier, or it could contain a non-hermetic barrier which allows gas molecules in the gas 29 to pass between the waveguide and the rest of the enclosure but prevents the passage of larger particles. In either case, the entire sealed enclosure 28 is filled by the gas 29, the waveguide is filled by the same gas 29 and the pressure of the gas 29 is the same inside the waveguide and in the rest of the enclosure 28.

The absence of hermetic sealing between the waveguide and the enclosure where the signal transmitter and receiver modules are located allows the signal to be transferred to and from the waveguide with well-known, low-loss coupling probes 221 and 222 because the coupling does not have to be implemented past a hermetic barrier. The sealed enclosure 28 can be manufactured and sealed with standard low-cost hermetic packaging technology. The frequency-reference device therefore has low cost and good long-term stability.

Figure 3:
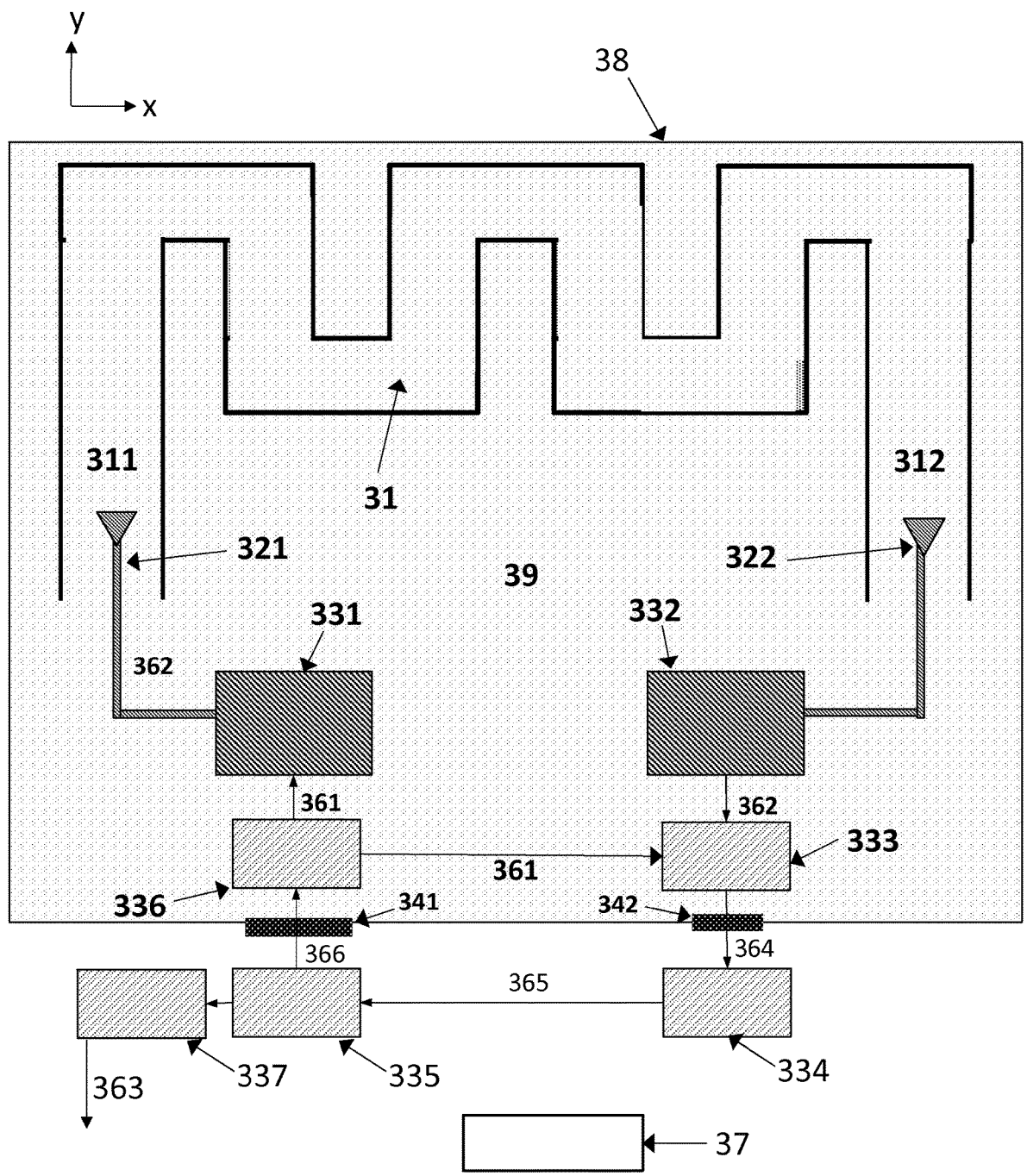
FIG. 3 illustrates a frequency reference device where the signal generator and lock-in amplifier are also inside the sealed enclosure.

The signal generator and other elements may alternatively be placed inside the sealed enclosure 28. FIG. 3 illustrates a frequency reference device where reference numbers 31, 311-312, 321-322, 331-337, 341-342, 361-366, 37, 38 and 39 correspond to reference numbers 21, 211-212, 221-222, 231-237, 241-242, 261-266, 27, 28 and 29, respectively, in FIG. 2. The frequency reference device in FIG. 3 therefore comprises a signal generator 336 which is coupled to the signal transmitter module 331 and a lock-in amplifier 333 which is coupled to the signal generator 336 and to the signal receiver module 332. The signal generator 336 and the lock-in amplifier 333 are located within the sealed enclosure 38. This arrangement has the advantage that all device components which process high-frequency signals 361 and 362 are inside the enclosure 38. The signals 364 and 366 which are passed through hermetic sealants 341-342 have frequencies which are far below the sub-THz-THz range. In this arrangement, possible losses from the transmission of high-frequency signals in signal wires through hermetic sealants are avoided.

Figure 4:
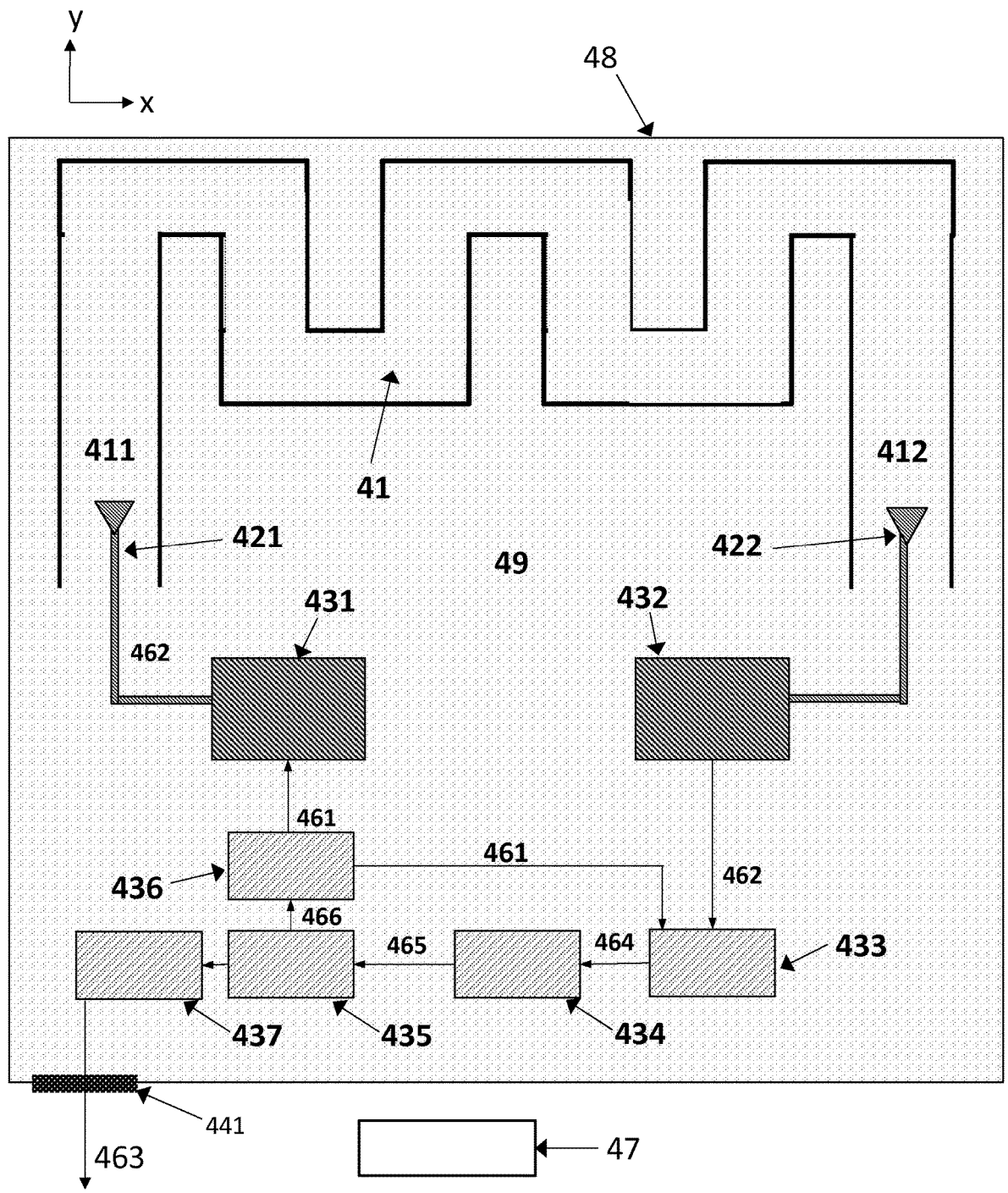
FIG. 4 illustrates a frequency reference device where the voltage-controlled oscillator, frequency counter and loop filter are also inside the sealed enclosure.

FIG. 4 illustrates a frequency reference devices where reference numbers 41, 411-412, 421-422, 431-437, 441, 461-466, 47, 48 and 49 correspond to reference numbers 31, 311-312, 321-322, 331-337, 341, 361-366, 37, 38 and 39, respectively, in FIG. 3. The frequency reference device shown in FIG. 4 therefore comprises a voltage-controlled oscillator 435 which is coupled to the signal generator 436, a frequency counter 437 which is coupled to the voltage-controlled oscillator 435 and a loop filter 434 which is coupled to the voltage-controlled oscillator 435 and to the lock-in amplifier 433. The voltage-controlled oscillator 435, frequency counter 437 and loop filter 434 are also here located within the sealed enclosure 48. The voltage-controlled oscillator may be a crystal oscillator.

The power supply 27, 37, 47 has been illustrated outside of the enclosure in all FIGS. 2, 3 and 4, but it could be placed inside the enclosure in any of these embodiments. In other words, the frequency reference device may comprise a power supply which is coupled to all electronic units in the device, and the power supply may be located within said sealed enclosure. This option has not been separately illustrated.

The invention claimed is:

1. A frequency reference device comprising
a waveguide with a first end and a second end,
a signal transmitter module for generating a high-frequency electromagnetic wave in the waveguide,
a signal receiver module for receiving the high-frequency electromagnetic wave in the waveguide,
wherein the signal transmitter module is connected to a first radiation coupling probe which is coupled to the waveguide at its first end, and the signal receiver module is connected to a second radiation coupling probe which is coupled to the waveguide at its second end, and the frequency reference device further comprises a sealed enclosure, and said sealed enclosure is filled with a gas,
wherein the waveguide, the first and second radiation coupling probes and the signal transmitter module and the signal receiver module are located within said sealed enclosure, and
wherein the waveguide is filled by the same gas as the sealed enclosure, and at least one of the first and second end of the waveguide is open, so that the pressure of the gas is the same inside the waveguide and in the rest of the enclosure.

2. A frequency reference device according to claim 1, characterized in that the frequency reference device also comprises a signal generator which is coupled to the signal transmitter module and a lock-in amplifier which is coupled to the signal generator and to the signal receiver module, and the signal generator and the lock-in amplifier are located within said sealed enclosure.

3. A frequency reference device according to claim 2, characterized in that the frequency reference device also comprises a voltage-controlled oscillator which is coupled to the signal generator, a frequency counter which is coupled to the voltage-controlled oscillator and a loop filter which is coupled to the voltage-controlled oscillator and to the lock-in amplifier, and the voltage-controlled oscillator, frequency counter and loop filter are located within said sealed enclosure.

4. A frequency reference device according to claim 1, characterized in that the frequency reference device also comprises a power supply which is coupled to all electronic units in the device, and the power supply is located within said sealed enclosure.

* * * * *